(12) United States Patent
Hütz

(10) Patent No.: US 6,259,040 B1
(45) Date of Patent: Jul. 10, 2001

(54) ELECTRICAL PRINTED CIRCUIT BOARD AND PROCESS

(75) Inventor: Uwe Hütz, Kierspe (DE)

(73) Assignee: Leopold Kostal GmbH & Co. KG, Ludenscheid (DE)

( * ) Notice: Subject to any disclaimer, the term of this patent is extended or adjusted under 35 U.S.C. 154(b) by 0 days.

(21) Appl. No.: 09/356,143

(22) Filed: Jul. 19, 1999

(30) Foreign Application Priority Data

Aug. 12, 1998 (DE) ............................................... 198 36 456

(51) Int. Cl.[7] .............................. H01R 12/04; H05K 1/16
(52) U.S. Cl. ........................ 174/267; 174/260; 361/760; 361/767; 439/83
(58) Field of Search ..................................... 174/262, 250, 174/260, 261, 267, 52.1, 52.4; 361/760, 768, 719, 721, 743, 761, 767, 785, 391; 439/79, 80, 876, 947, 45, 63, 119, 780, 792, 842, 866, 867, 881, 883, 78, 83

(56) References Cited

U.S. PATENT DOCUMENTS

| | | | |
|---|---|---|---|
| 4,992,052 | * | 2/1991 | Verhoeven ............................... 439/62 |
| 5,108,295 | * | 4/1992 | Koike et al. ............................. 439/79 |
| 5,269,694 | * | 12/1993 | Kachlic et al. ......................... 439/79 |
| 5,876,221 | * | 3/1999 | Sasaki ...................................... 439/79 |
| 5,921,788 | * | 7/1999 | Wilson et al. ........................... 439/78 |
| 5,999,412 | * | 12/1999 | Busse et al. ........................... 361/761 |
| 6,179,631 | * | 1/2001 | Downes et al. ......................... 439/83 |

FOREIGN PATENT DOCUMENTS

400539 * 12/1990 (DE) .

* cited by examiner

Primary Examiner—Jeffrey Gaffin
Assistant Examiner—I B Patel
(74) Attorney, Agent, or Firm—Brooks & Kushman P.C.

(57) ABSTRACT

The present invention relates to an electrical printed circuit board having plug contact elements oriented with its longitudinal axis parallel to the surface of the printed circuit board. The plug contact elements are connected to the printed circuit board by means of a reflow soldering process. The printed circuit board solves the technical problem of holding the plug contact elements, which are to be mounted horizontally on the printed circuit board, in designated positions from the time of placement until setting of the solder connection. The technical problem is solved, without the aid of additional mechanical components, adhesive media or the like, by aperture or slots in a second printed circuit board portion. The lengths and widths of the slots are dimensioned to cooperate with the lengths and widths of the plug contact elements to hold the plug contact elements in optimum soldering positions on the printed circuit board.

5 Claims, 1 Drawing Sheet

ELECTRICAL PRINTED CIRCUIT BOARD AND PROCESS

TECHNICAL FIELD

The present invention relates generally to electrical printed circuit boards and, more particularly, to an electrical printed circuit board having at least one plug contact element oriented with its longitudinal axis parallel to the surface of the printed circuit board and connected to this surface using a reflow soldering process.

BACKGROUND ART

Reflow soldering processes produce a solder connection of surface mountable components to connection regions of a printed circuit board. These surface mountable components are referred to as SMD components. A reflow soldering process includes four steps. First, solder paste is provided on solder surfaces of the printed circuit board. The solder paste forms the connection regions. A screen-printing process is employed to provide the solder paste on the solder surfaces. Second, the SMD circuit components are then pressed with their connections into the solder paste of the corresponding solder surface. An automatic placement machine presses the SMD components into the solder paste.

Third, the assembled printed circuit board then passes through a temperature profile in a reflow soldering installation. Temperature profile components of the solder paste undergo gas-phase stripping before a flux agent contained therein is activated. Fourth, the solder metal contained in the solder paste is melted. Consequently, the solder connection is produced.

Throughout the process of assembling the printed circuit board until the solder connection sets, the SMD components are held in their position only by the adhesive strength of the solder paste. This is possible because the SMD components are generally relatively small and light. The SMD components further have at least two connection contacts.

However, it is often necessary to provide intersection points for subsequent connection of the printed circuit board to other devices. These intersection points take the form of plug connectors. If plug contact elements are used for plug connectors they must be mounted with their longitudinal axis parallel to the surface of the printed circuit board. The sole contact points, i.e., single solder paste attachments, on the printed circuit board on which respective plug connectors are mounted to cannot adequately hold the plug connectors in the desired position. In particular, round plug contact elements are typically in the form of solid turned parts having an elongate cylindrical form and a relatively large mass. A problem is that because of shaking to which the printed circuit board is typically subjected to during the course of processing, forces and turning moments arise which far exceed the holding force applied by the single solder paste attachment.

DISCLOSURE OF INVENTION

Accordingly, it is an object of the present invention to provide an electrical circuit board for a reflow soldering process having means for holding plug contact elements in the designated position until the solder connection has set in which the plug contact elements are positioned with SMD circuit components in one working process.

The present invention achieves this object without the aid of additional mechanical components, adhesive media or the like. The present invention employs apertures or slots in the printed circuit board having a length and width dimensioned such that in cooperation with the lengths and cross-sections of the plug contact elements an optimum soldering position thereof on the printed circuit board is achieved. In a particularly advantageous embodiment the plug contact elements are round and have portions of different diameters.

In carrying out the above object and other objects, the present invention provides an electrical printed circuit board. The electrical circuit board includes first and second printed circuit boards. The first printed circuit board portion has a metal connection region and the second printed circuit board portion has a slot therein. A plug contact element is oriented with its longitudinal axis parallel to the surface of the printed circuit board. The plug contact element has a head and a body. The head of the plug contact element is positioned adjacent to the metal connection region to be soldered thereto. The body of the plug contact element is at least partially disposed in the slot in order to be positioned and secured from the moment the head of the plug contact element has been positioned adjacent to the metal connection region until the head of the plug contact element has been soldered to the metal connection region.

The above objects and other objects, features, and advantages of the present invention are readily apparent from the following detailed description of the best mode for carrying out the present invention when taken in connection with the accompanying drawings.

BEST MODE FOR CARRYING OUT THE INVENTION

Figure 1:
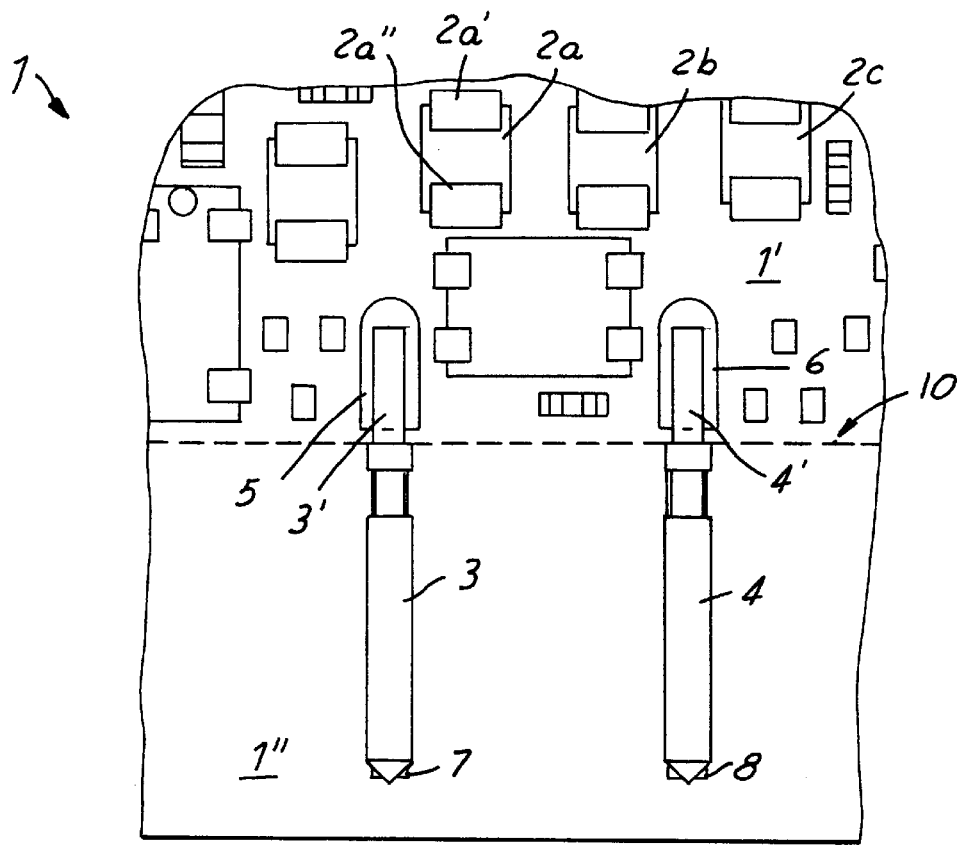
FIG. 1 shows a view of the upper side of a portion of an electrical printed circuit board in accordance with the invention.
Figure 2A:
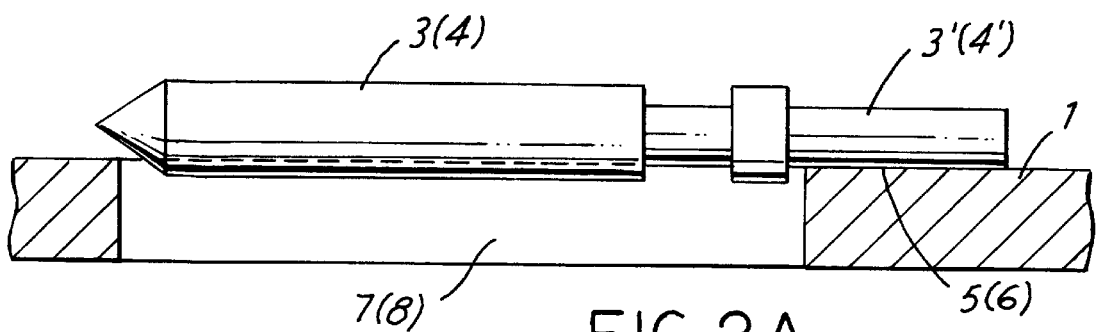
FIGS. 2A and 2B show a round, pin-shaped plug contact element on an electrical printed circuit board in accordance with the invention in a longitudinal and cross-sectional view.
Figure 2B:
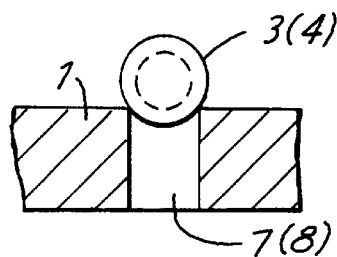

As shown in FIG. 1 SMD components 2a, 2b, and 2c are mounted on the upper side of an electrical printed circuit board 1 in accordance with the present invention. SMD components 2a, 2b, and 2c are positioned on printed circuit board 1 at two different connection regions. For instance, SMD component 2a is connected at two places to connection regions 2a' and 2a". Connection regions 2a' and 2a" represent solder surfaces. Printed circuit board 1 further includes two round pin-like plug contact elements 3 and 4. Plug contact elements 3 and 4 are positioned on printed circuit board 1 such that their end portions 3' and 4', which are to contact the printed circuit board, lie on solder surfaces 5 and 6. End portions 3' and 4' provide intersection contact points. End portions 3' and 4' lie on solder surfaces 5 and 6 to contact and be mounted to printed circuit board 1. The remaining portions of round pin-like plug contact elements 3 and 4 lie in slots 7 and 8 in printed circuit board 1. The remaining portions of plug contact elements 3 and 4 are provided for subsequent contact with corresponding bushing-like plug contact elements.

Slots 7 and 8 extend parallel to the longitudinal axis of the plug contact elements 3 and 4. The remaining portions of plug contact elements 3 and 4 lie in slots 7 and 8 below the surface of printed circuit board 1. Thus, the remaining portions of plug contact elements 3 and 4 are held in position by gravity while printed circuit board 1 is kept substantially horizontal during subsequent handling.

The length and width of slots 7 and 8 in printed circuit board 1 and the diameters of round pin-like plug contact elements 3 and 4 are coordinated with respect to one another such that the plug contact elements are held in place until the solder connections sets. The diameter of plug contact elements 3 and 4 vary over the length of the plug contact elements. As a result, the correct positioning of the plug contact elements in the finished product are ensured. Further, it is ensured that end portions 3' and 4' are properly positioned on solder surfaces 5 and 6 to be properly soldered.

After completion of the soldering of portion 1' of printed circuit board 1, portion 1" of the printed circuit board is separated along a line 10 from portion 1'. SMD components 2a, 2b, and 2c and end portions 3' and 4' of respective plug contact elements 3 and 4 are soldered on portion 1' of printed circuit board 1. The remaining portions of plug contact elements 3 and 4 are released from slots 7 and 8 of portion 1" as portion 1" is separated from portion 1'. Line 10 is preferably a weakness such as a milled groove or the like introduced during production of the unassembled printed circuit board.

The printed circuit board in accordance with the present invention is suitable for producing a plurality of mutually independent, identical and different circuits mechanically separable from each other after completion of the solder connection.

For the plug contact elements it is, of course, also possible to use bushing-like elements and/or elements with non-round cross-sections in addition to the pin-like and round elements shown in the drawings.

The printed circuit board in accordance with the present invention can be used in a manufacturing process in which the assembly of the printed circuit board consists entirely of SMD components and plug contact elements. In such a manufacturing process, the plug contact elements are positioned in place by the same automatic placement machines used for positioning the SMD components. Thus, the SMD components and the plug contact elements can be positioned in one working process.

Thus it is apparent that there has been provided, in accordance with the present invention, an electrical printed circuit board that fully satisfies the objects, aims, and advantages set forth above. While the present invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. An electrical printed circuit board comprising:

a first printed circuit board portion having a metal connection region located on the surface of the first circuit board portion;

a second printed circuit board portion having a slot therein;

a plug contact element oriented with its longitudinal axis parallel to the surfaces of the first and second printed circuit board portions, the plug contact element having a head and a body, the head of the plug contact element positioned adjacent to the metal connection region to be soldered thereto by means of a reflow soldering process and the body of the plug contact element at least partially disposed in the slot in order for the head of the plug contact element to be positioned and secured from the moment the head of the plug contact element has been positioned adjacent to the metal connection region until the head of the plug contact element has been soldered to the metal connection region; and a groove separating the first and second printed circuit board portions, wherein the second printed board portion is mechanically separated from the first printed circuit board along the groove after the head of the plug contact element has been soldered to the metal connection region thereby releasing the body of the plug contact element from the slot.

2. The electrical printed circuit board of claim 1 wherein:

the second printed circuit board portion has a plurality of slots for positioning and holding respective plug contact elements.

3. The electrical printed circuit board of claim 1 wherein:

the body of the plug contact element has different cross-sections over its length and the slot has corresponding widths such that the head of the plug contact element is held in position adjacent to the metal connection region to be soldered thereto.

4. The electrical printed circuit board of claim 1 wherein:

the body of the plug contact element has a round cross-section and the slot extends parallel to the longitudinal axis of the plug contact element.

5. The electrical printed circuit board of claim 1 further comprising:

SMD components soldered to the first circuit board portion.

* * * * *